United States Patent [19]

Carayannis et al.

[11] Patent Number: 5,315,687
[45] Date of Patent: May 24, 1994

[54] SIDE FED SUPERLATTICE FOR THE PRODUCTION OF LINEAR PREDICTOR AND FILTER COEFFICIENTS

[75] Inventors: George Carayannis; Christos Halkias, both of Athens, Greece; Dimitris Manolakis, Chestnut Hill, Mass.; Elias Koukoutsis, Athens, Greece

[73] Assignee: Adler Research Associates, Union, N.J.

[21] Appl. No.: 950,728

[22] Filed: Sep. 24, 1992

Related U.S. Application Data

[63] Continuation of Ser. No. 826,211, Jan. 22, 1992, abandoned, which is a continuation of Ser. No. 443,048, Nov. 27, 1989, abandoned, which is a continuation of Ser. No. 310,492, Feb. 14, 1989, abandoned, which is a continuation of Ser. No. 84,929, Aug. 12, 1987, abandoned, which is a continuation-in-part of Ser. No. 837,260, Mar. 7, 1986, abandoned.

[51] Int. Cl.$^5$ ............................ G10L 9/02
[52] U.S. Cl. ................................ 395/2.28
[58] Field of Search ............. 381/29-53; 395/2.28; 364/133, 724.01, 724.15, 724.17

[56] References Cited

U.S. PATENT DOCUMENTS

| | | | |
|---|---|---|---|
| 3,662,115 | 5/1972 | Saito | 395/2 |
| 4,340,781 | 7/1982 | Ichikawa et al. | 381/41 |
| 4,378,469 | 3/1983 | Fette | 179/1 SA |
| 4,389,540 | 6/1983 | Nakamura et al. | 381/41 |
| 4,401,855 | 8/1983 | Broderson et al. | 381/41 |
| 4,544,919 | 10/1985 | Gerson | 364/724 |
| 4,641,238 | 2/1987 | Kneib | 364/200 |
| 4,740,906 | 4/1988 | Renner et al. | 364/724 |
| 4,750,190 | 6/1988 | Moreau et al. | 375/27 |

OTHER PUBLICATIONS

N. Levinson, "The Wiener RMS (Root-Mean-Square) Error Criterion in Filter Design and Prediction", J. Math Phys., vol. 25, pp. 261-278, Jan. 1947.
J. Durbin, "The Filtering of Time Series Models", Rev. Int. Statist. Inst., vol. 28, pp. 233-244, 1960.
I. Schur, "Uber Potenzreihen Die In Innern Des Einheitskreises Beschrankt Sind", J. Reine Angewandte Mathematik, vol. 147, 1917, pp. 205-232.
H. Lev-Ari and T. Kailath, "Schur and Levinson Algorithms for Non-Stationary Processes", IEEE International Conference on Acoustics, Speech and Signal Processing, 1981, pp. 860-864.
Le Roux and Gueguen, "A Fixed Point Computation of Partial Correlation, Coefficients", IEEE Transactions on Acoustics, Speech, and Signal Processing, Jun. 1977, pp. 257-259.
Kung and Hu, "A Highly Concurrent algorithm and Pipelined Architecture for Solving Toeplitz Systems", IEEE Transactions on Acoustics, Speech and Signal Processing, vol. ASSP-31, No. 1, Feb. 1983, pp. 66-76.
G. Carayannis et al., "A New Look on the Parallel Implementation of the Schur Algorithm for the Solution of Toeplitz Equations", IEEE International Conference on Acoustics, Speech and Signal Processing, Mar. 26-29, 1985, pp. 1-5.
G. Carayannis et al., "Fast Recursive Algorithms for a Class of Linear Equations", IEEE Transactions on Acoustics, Speech and Signal Processing, vol. ASSP-30, No. 2, Apr. 1982, pp. 227-239.

*Primary Examiner*—Michael R. Fleming
*Assistant Examiner*—Michelle Doerrler
*Attorney, Agent, or Firm*—Davis Hoxie Faithfull & Hapgood

[57] ABSTRACT

Signal processing structures for providing direct prediction coefficients and direct Least Square-Finite Impulse Response (LS-FIR) filter coefficients. The structures include one or more processors, and a storage and retrieval structure for selectively storing predictor and filter coefficients and intermediate variables, to thereby allow the one or more real processors to emulate a plurality of virtual processors, which take the form of a side fed superlattice structure, in the case of linear prediction, and a side-fed superlattice-superladder structure, in the case of direct LS-FIR filtering.

24 Claims, 12 Drawing Sheets

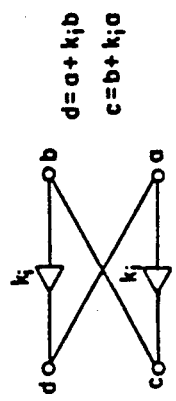
FIG.4A LATTICE BASIC CELL
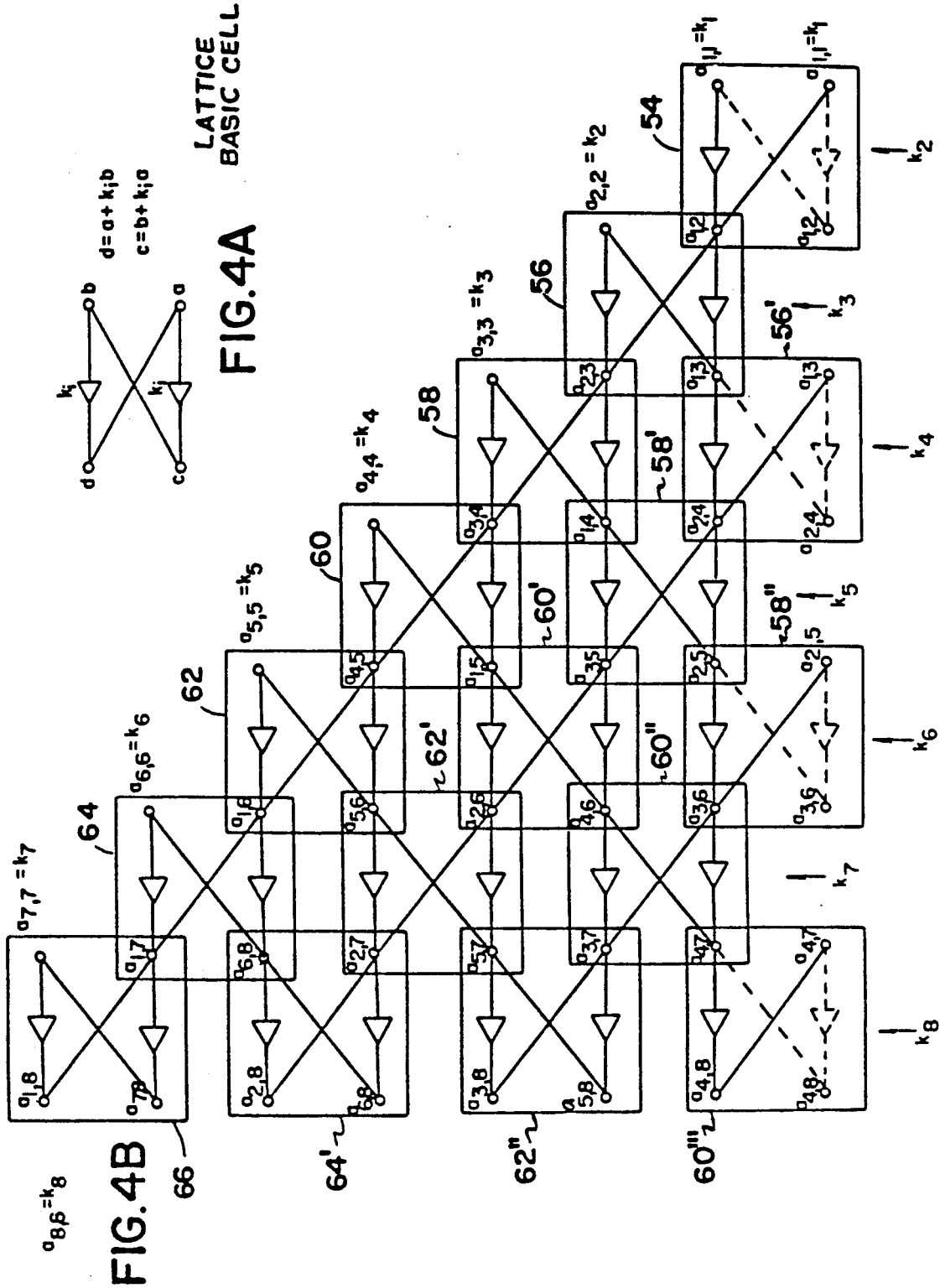
FIG.4B

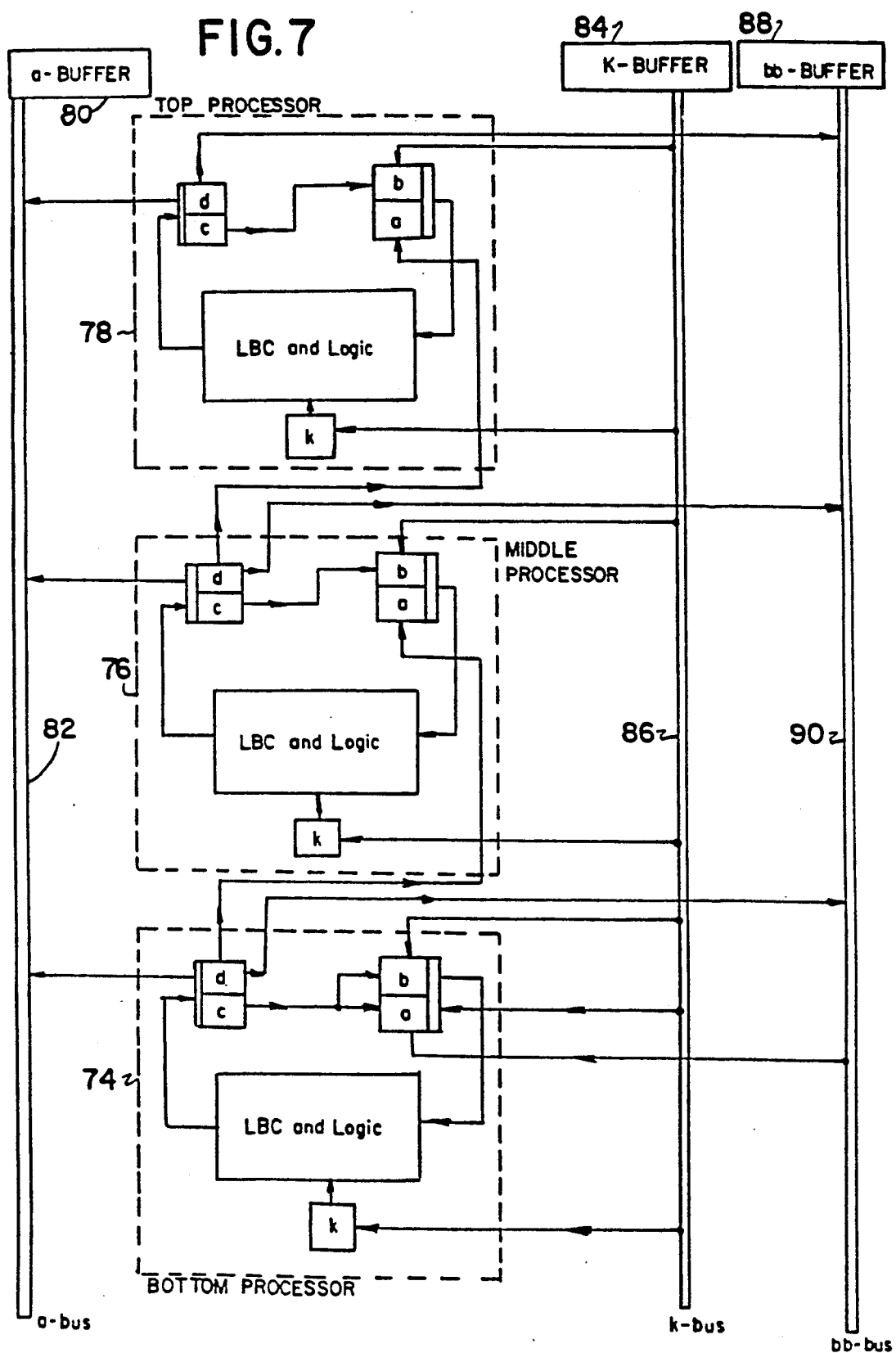

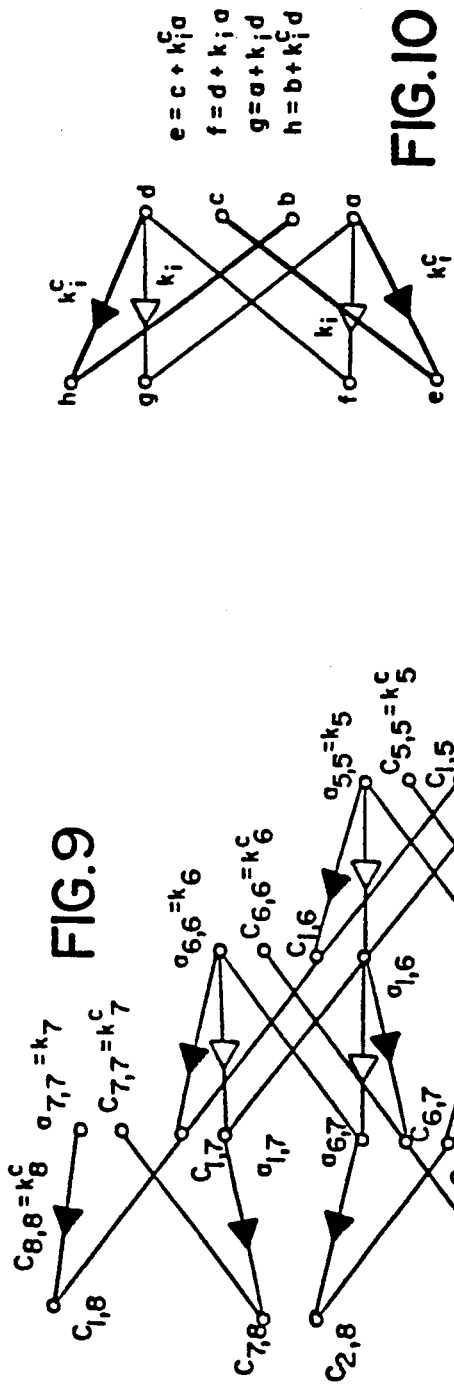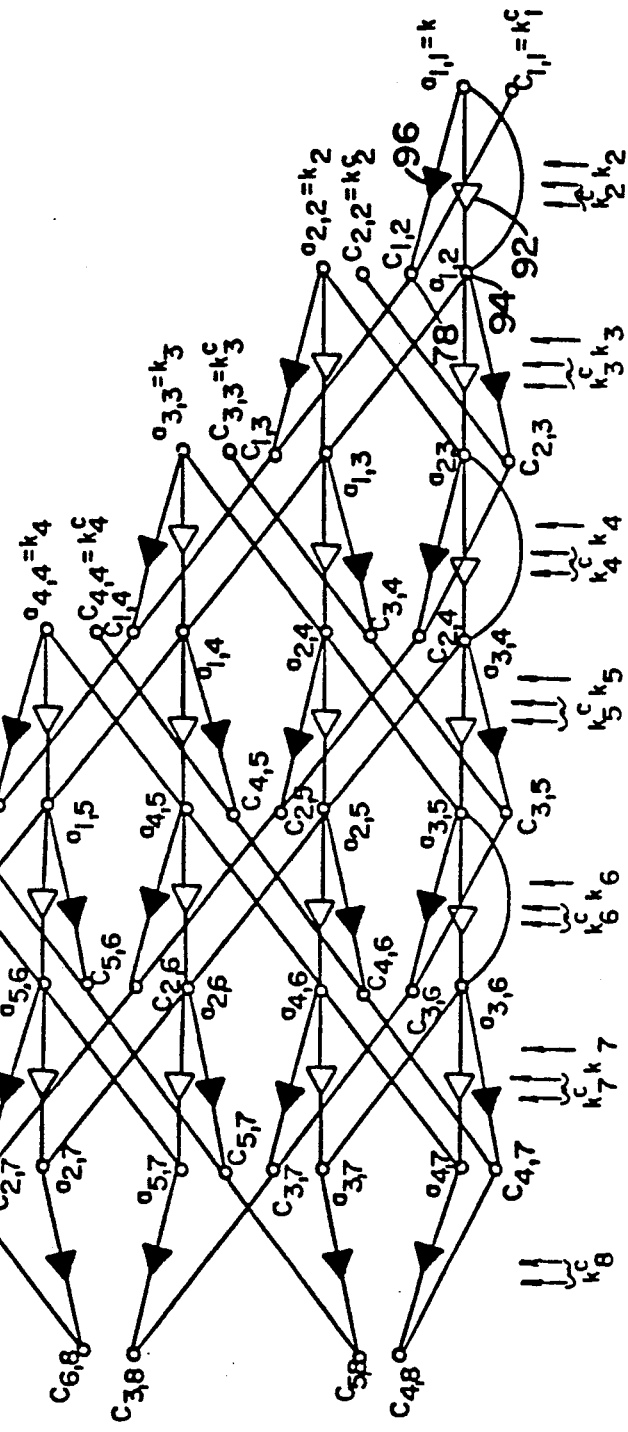

SIDE FED SUPERLATTICE FOR THE PRODUCTION OF LINEAR PREDICTOR AND FILTER COEFFICIENTS

CROSS REFERENCE TO RELATED APPLICATIONS

This is a continuation of copending application Ser. No. 07/826,211 filed on Jan. 22, 1992 now abandoned, which is a continuation of copending application Ser. No. 07/443,048 filed on Nov. 27, 1989 now abandoned, which is a continuation of copending application Ser. No. 07/310,492 filed on Feb. 14, 1989 now abandoned, which was a continuation of copending application Ser. No. 07/084,929 filed on Aug. 12, 1987 now abandoned, which was a continuation-in-part of Ser. No. 06/837,260 filed Mar. 7, 1986, now abandoned, and entitled "OPTIMAL PARAMETRIC SIGNAL PROCESSOR".

This application is also related to co-pending U.S. patent applications Ser. No. 904,382 by Carayannis et al., filed Sep. 4, 1986, entitled "OPTIMAL PARAMETRIC SIGNAL PROCESSOR WITH LATTICE BASIC CELL", and Ser. No. 021,256, by Koukoutsis et al., filed Mar. 3, 1987, entitled "OPTIMAL PARAMETRIC SIGNAL PROCESSOR FOR LEAST SQUARE FINITE IMPULSE RESPONSE FILTERING". The entire disclosures of each of the three applications identified above are hereby incorporated by reference thereto.

FIELD OF THE INVENTION

The present invention relates to the field of signal processing, and in particular, parametric signal processing.

BACKGROUND OF THE INVENTION

Parametric signal processing is used in many areas such as speech and image analysis, synthesis and recognition, neurophysics, geophysics, array processing, computerized tomography, communications and astronomy, to name but a few.

One example of signal processing of particular importance is the linear predition technique which may be used for spectral estimation, and in particular for speech analysis, synthesis and recognition and for the processing of seismic signals, to enable the reconstruction of geophysical substrata. The linear prediction technique employs a specialized autocorrelation function.

Another form of signal processing which finds a multitude of applications, is the determination of an optimal (in the least square sense) finite impulse response (FIR) filter. A signal processor employing such a technique works with the autocorrelation of the filter input signal and the cross-correlation between the input and the desired response signal, and may be used in many of the above-mentioned applications.

Still another form of signal processing of particular importance is known in the art as "L-step ahead" prediction and filtering, for solving the "optimum lag" problem. This technique is especially useful in designing spiking and shaping filters. Signal processors which perform this function employ a specialized autocorrelation function which also takes into account a time lag associated with the system.

Generally, as the order of the system under investigation increases, the complexity of the signal processing necessary to provide useful information also increases.

For example, using the general Gaussian elimination procedure, a system of order p can be processed in "$O(p^3)$" steps, indicating the number of steps as being "on the order of" $p^3$, i.e., a function of p cubed. Thus, it will be appreciated that a system having order of $p=100$ requires on the order of one million processing steps to process the signal, a limitation of readily apparent significance, especially where real time processing is required.

Signal processing techniques have been developed which have reduced the number of operations required to process a signal. One such method has been based on a technique developed by N. Levinson, which requires $O(p^2)$ sequential operations to process the signal. In particular, the "Levinson technique" requires $O(2.p^2)$ sequential operations in order to process the signal. An improved version of this technique, known as the "Levinson-Durbin" technique requires $0(1.p^2)$ sequential operations to process the signal. Neither of these schemes is suitable for parallel implementation. On the general subject of the Levinson and Levinson-Durbin techniques, see N. Levinson, "The Wiener RMS (Root-Mean-Square) Error Criterion in Filter Design and Prediction", *J. Math Phys.*, Vol. 25, pages 261–278, January 1947; and J. Durbin, "The Filtering of Time Series Models", *Rev. Int. Statist. Inst.*, Vol. 28, pages 233–244, 1960.

Although they represent an order of magnitude improvement over the Gaussian elimination technique, the Levinson and Levinson-Durbin techniques are too slow for many complex systems where real time processing is required.

Another way of implementing the main recursion of the Levinson-Durbin technique, for the computation of what is widely known as "lattice coefficients", was developed by Schur in 1917in order to establish a system stability criterion. See I. Schur, "Uber Potenzreihen Die In Innern Des Einheitskreises Beschrankt Sind", *J. Reine Angewandte Mathematik*, Vol. 147, 1917, pages 205–232. Lev-Ari and Kailath, of Stanford University, have developed a different approach, based on the Schur and Levinson techniques, which provides a triangular "ladder" structure for signal processing. The Lev-Ari and Kailath technique uses the signal, per se, as the input to the processor, rather than autocorrelation coefficients, and it is used in the signal modelling context. See H. Lev-Ari and T. Kailath, "Schur and Levinson Algorithms for Non-Stationary Processes", *IEEE International Conference on Acoustics, Speech and Signal Processing*, 1981, pages 860–864.

In another modification to the Schur technique, Le Roux and C. Gueguen re-derived the Schur algorithm, giving emphasis to the finite word length implementation, using fixed point arithmetics. See Le Roux and Gueguen, "A Fixed Point Computation of Partial Correlation, Coefficients", *IEEE Transactions on Acoustics, Speech, and Signal Processing*, June 1977, pages 257–259.

Finally, Kung and Hu, have developed a parallel scheme, based on the Schur technique, which uses a plurality of parallel processors, to process a signal, having order p, in O(p) operations, a significant improvement compared to the Levinson-Durbin technique. See Kung and Hu, "A Highly Concurrent Algorithm and Pipelined Architecture for Solving Toeplitz Systems", *IEEE Transactions on Acoustics, Speech and Signal Processing*, Vol. ASSP-31, No. 1, February 1983, pp. 66–76. However, the application of the Kung and Hu technique is severely limited insofar as it requires that the number of processors be equal to the order of the system to be solved. Thus, the Kung and Hu technique cannot process a signal produced by a system having an order greater than the number of parallel processors. System complexity is therefore a major limiting factor in using the Kung and Hu technique, insofar as many complex systems may have orders much higher than the number of parallel processors currently available in modern VLSI or other technology.

OBJECTS AND SUMMARY OF THE INVENTION

It is therefore an object of the present invention to overcome the difficulties associated with prior art signal processors and methods.

It is another object of the present invention to provide an optimal parametric signal processor and processing method for obtaining linear predictor coefficients, and linear filter coefficients.

It is another object of the present invention to provide signal processors and processing methods, for linear prediction and LS-FIR filtering.

It is another object of the present invention to provide signal processors and processing methods, for linear prediction and LS-FIR filtering, which can be implemented using (i) a single processing unit to process a signal in a fully sequential manner, (ii) a plurality of processing units to process a signal in a fully parallel manner, or (iii) a lesser plurality of processing units to process a signal in a "partitioned parallel" manner.

It is another object of the present invention to provide a linear prediction and LS-FIR signal processing structure having minimal hardware complexity.

In accordance with the first aspect of the present invention, a signal processor which receives a plurality of lattice predictor coefficients $k_i$ and produces therefrom a substantially corresponding number of direct predictor coefficients $a_{i,j}$, includes at least one real processor having three inputs, a, b and k, and producing two outputs c and d, where $c = b + k_i a$ and $d = a + k_i b$. The k input receives one of the lattice predictor coefficients $k_i$ during a particular time interval. A storage and retrieval structure for selectively storing the values of c, d and $k_i$ selectively applies these values to the a, b and k inputs of the real processor, such that the real processor receives as one of its a and b inputs a lattice predictor coefficient $k_i$ during a first time interval, and receives from the storage and retrieval structure as one of its a and b inputs, during a second time interval after the first time interval, at least one c or d output produced by the real processor. The real processor produces a pair of direct predictor coefficients $a_{i,j}$ during a third time interval concurrent with, or after the second time interval.

In accordance with a second aspect of the present invention, a plurality of the real processors are provided, each having three inputs a, b and k and two outputs c and d, as defined above. The storage and retrieval structure selectively stores the values of c, d and $k_i$ and selectively applies these values to the a, b and k inputs of the plurality of real processors. At least one of the real processors receives as one of its a and b inputs a lattice predictor coefficient $k_i$ during a first time interval, and at least some of the plurality of real processors receive from the storage and retrieval structure as their a and b inputs, during a second time interval after the first time interval, the outputs produced by selected ones of the plurality of real processors. The number of real processors may be less than the order of the system under study, and in such case, the signal processor processes the signals in a "partitioned parallel manner".

In accordance with a third aspect of the present invention, the signal processor includes the plurality of real processors, the storage and retrieval structure for selectively storing the values of c, d and $k_i$, and for selectively applying those values to the a, b and k inputs of the real processors, to thereby allow the plurality of real processors to emulate a plurality of virtual processors. Each of a first group of virtual processors receives as its a and b inputs one output from each of a pair of previous virtual processors. Each of a second group of virtual processors receives as one of its inputs one of the plurality of lattice coefficients $k_i$, and as the other of its inputs an output from a previous virtual processor. Finally, each of a third group of virtual processors produces at its c and d outputs a pair of direct predictor coefficients.

More specifically, the first group of virtual processors can receive as its a input the d output of a first of the previous pair of virtual processors, and as its b input the c output of a second of the previous pair of virtual processors, the previous pair of virtual processors receiving at their k inputs the same value of $k_i$. Further, each of the second group of virtual processors receives one of the plurality of lattice coefficients at its b input. A fourth group of virtual processors is also provided, each of which receives as its a and b inputs the same quantity, such that the real and virtual processors form a superlattice structure, the second, third and fourth groups of which form the borders thereof.

Each real processor can take the form of a single, two-cycled processor, or two single cycled processors.

In accordance with a fourth aspect of the present invention, a signal processor which receives a plurality of lattice predictor and filter coefficients $k_i$ and $k_i^f$, produces therefrom a substantially corresponding number of direct filter coefficient $c_{i,j}$. The signal processor is formed of a plurality of real processors, each having six inputs a, b, c, d, $k_i$ and $k_i^f$, and four outputs e, f, g, and h, such that $$e = c + k_i^f a$$

$$f = d + k_i a$$

$$g = a + k_i d$$

$$h = b + k_i^f d$$

The $k_i$ and $k_i^f$ inputs to each processor receive the lattice predictor and filter coefficients $k_i$ and $k_i^f$, respectively. A storage and retrieval structure for selectively storing the above values, and for selectively supplying those values to the inputs to the real processors, thereby allow the plurality of real processors to emulate a plurality of virtual processors. Each of a first group of virtual processors receives as its a and b inputs the g and h outputs of a first previous virtual processor, and as its c and d inputs the e and f outputs of a second previous virtual processor, adjacent to the first previous processor. Each of a second group of virtual processors receives as its c and d inputs selected values of lattice predictor and filter coefficients $k_i$ and $k_i^f$, and as its a and b inputs, the g and h outputs of a previous virtual processors. Finally, each of a third group of virtual processors produces as its e and h outputs a pair of direct filter coefficients $c_{i,j}$.

BRIEF DESCRIPTION OF THE DRAWINGS

These and other objects, aspects and embodiments of the invention will be described in more detail with reference to the following drawing figures, of which:

FIG. 4A illustrates the lattice basic cell of the side-fed superlattice of FIG. 3;

FIG. 4B is an illustration of how the side-fed superlattice of FIG. 3 is implemented using the lattice basic cell of FIG. 4A, in a "building block" fashion;

FIG. 7 is a schematic illustration showing a hardware realization of the side-fed superlattice of FIGS. 5 and 6;

FIG. 9 is an illustration of a non-redundant side-fed superlattice-superladder structure, for the symmetrical case;

FIG. 10 is an illustration of a basic cell which can implement the reduced side-fed superlattice-superladder structure of FIG. 9.

DETAILED DESCRIPTION OF THE INVENTION

Since the present invention is related to the copending applications, Ser. Nos. 837,260, 904,382 and 021,256, a description of the relevant parts of those applications, as they relate to the present invention, will be made, with reference to FIGS. 1 and 2.

Figure 1:
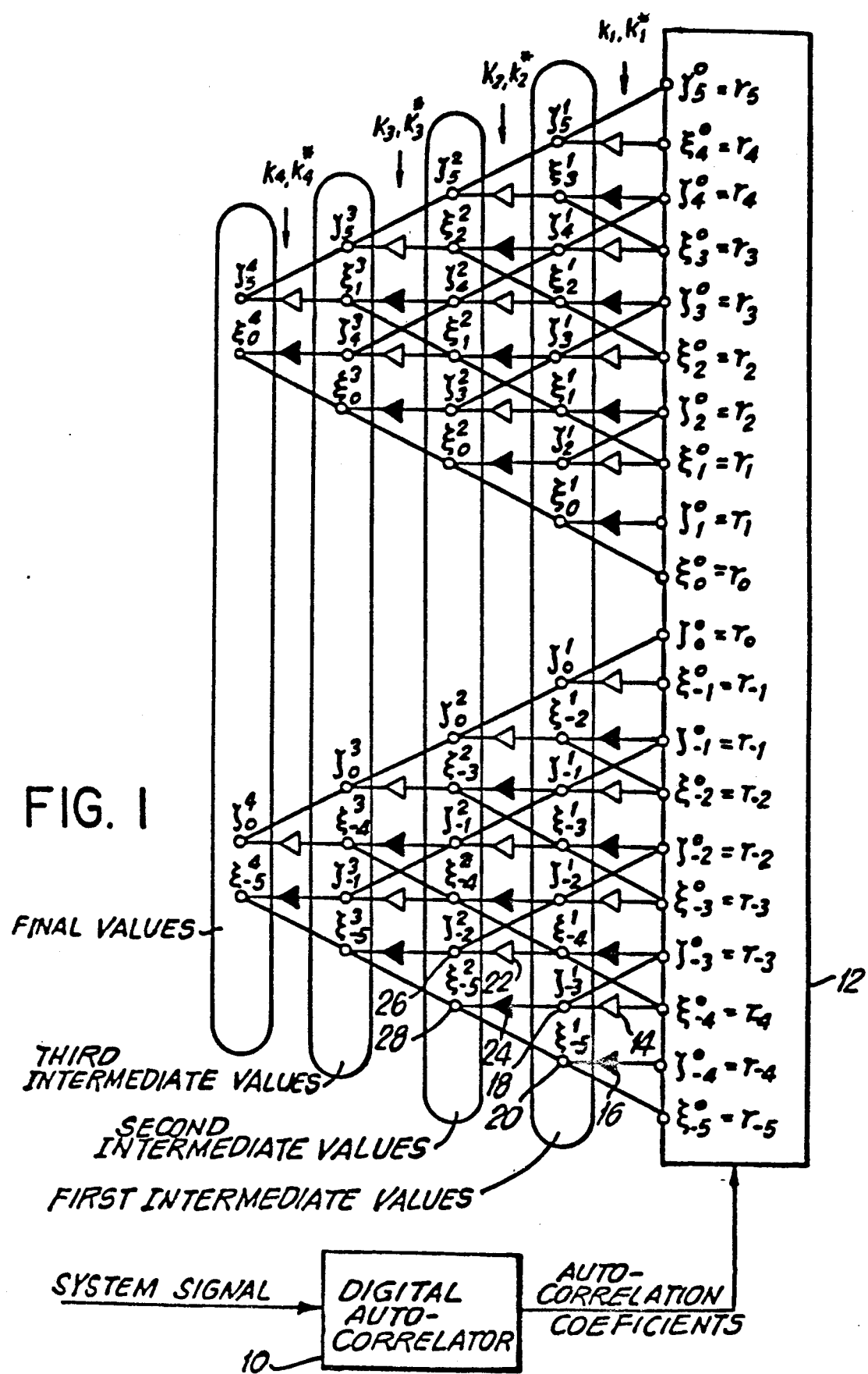
FIG. 1 illustrates the superlattice structure, for the non-symmetrical case, in accordance with the parent application Ser. No. 837,260, for producing lattice predictor coefficients.

With reference to FIG. 1, there is shown a "superlattice" structure of multipliers, designated by triangles, and adders, designated by circles, arranged in a manner to process a signal in order to produce a predictor for a non-symmetrical system. This superlattice structure forms the basis for the linear prediction and LS-FIR processor of the present invention.

As shown in FIG. 1, a signal from a system having order P, such as a communications channel, for example, is applied to a well known digital autocorrelator 10, which produces autocorrelation coefficients $r_{-5}$ through $r_5$. The autocorrelation coefficients are delivered to an input device 12, such as a digital register, or buffer memory, for application to the superlattice structure. With the exception of autocorrelation coefficients $r_{-5}$, $r_0$ and $r_5$, each autocorrelation coefficient is applied to a pair of multipliers which function to multiply each coefficient by a pair of "lattice predictor coefficients" $k_n$ and $k_n^*$, $k_n$ being the "normal" lattice predictor coefficient, and $k_n^*$ being the "adjoint" lattice predictor coefficient. The multipliers indicated by white triangles function to multiply the autocorrelation coefficients by the normal lattice predictor coefficient $k_n$, while the multipliers indicated by the black triangles function to multiply the autocorrelation coefficients by the adjoint lattice predictor coefficients $k_n^*$. Production of the normal and adjoint lattice predictor coefficients will be described below.

The two products produced by multiplying each autocorrelation coefficient by the normal and adjoint lattice predictor coefficients are added, in the adders indicated by the circles in the figure, to an adjacent pair of autocorrelation coefficients, to produce a set of first intermediate values $\zeta_n^1$, where n = −3, −2, −1, 0, 2, 3, 4, 5, and $\xi_m^1$, where m = −5, −4, −3, −2, 0, 1, 2, 3. For example, the autocorrelation coefficient $r_{-4}$ is multiplied by $k_1$ and $k_1^*$ in multipliers 14 and 16, respectively, and the products are added to the pair of autocorrelation coefficients $r_{-3}$ and $r_{-5}$, which are adjacent to coefficient $r_{-4}$, in adders 18 and 20, respectively. Similarly, autocorrelation coefficient $r_{-3}$, after multiplication by lattice predictor coefficients $k_1$ and $k_1^*$, is individually added to the adjacent pair autocorrelation coefficients $r_{-4}$ and $r_{-2}$. The same process takes place for autocorrelation coefficients $r_{-2}$ through $r_4$, to produce the set of first intermediate values, as shown.

For the sake of continuity, the autocorrelation coefficients $r_{-5}$ through $r_5$, are also designated as $\zeta_n^0$ and $\xi_m^0$ where n = −4 to 5 and m = −5 to 4.

The lattice predictor coefficients are derived from the intermediate values as follows:

$$k_{m+1} = -\zeta_{m+1}/\zeta_0^m$$

$$k^*_{m+1} = -\xi_{m+1}/\xi_0^m$$

The lattice predictor coefficients $k_1$ and $k_1^*$ are produced directly from the autocorrelation coefficients, while the second set of lattice predictor coefficients, $k_2$ and $k_2^*$, are derived from the first intermediate values.

In a manner similar to that performed to generate the first intermediate values, selected pairs of adjacent first intermediate values, for example, $\xi_{-4}^1$ and $\zeta_{-3}^1$ are multiplied by the normal and adjoint lattice predictor coefficients $k_2$ and $k_2^*$, respectively, in multipliers 22 and 24. Two first intermediate values $\zeta_{-2}^1$ and $\xi_{-5}^1$, adjacent to, and on either side of the selected pair, are added to the products produced by multipliers 22 and 24 in adders 26 and 28, respectively, to produce two second intermediate values $\zeta_{-2}^2$ and $\xi_{-5}^2$. The remaining second intermediate values are generated in a similar manner, namely, by multiplying a selected pair of adjacent first intermediate values by the normal and adjoint lattice predictor coefficients $k_2$ and $k_2^*$, and by adding to the products the first intermediate values adjacent to, and on either side of, the selected pair.

It will also be seen that, following this signal flow, the third intermediate values and final intermediate values are generated in a similar manner.

The arrangement shown in FIG. 1 can produce lattice coefficients for a system of the type $Ra = -r$, where R has a Toeplitz structure. A detailed analysis of this technique is given by G. Carayannis et al., "A New Look on the Parallel Implementation of the Schur Algorithm for the Solution of Toeplitz Equations", *IEEE International Conference on Acoustics, Speech and Signal Processing*, Mar. 26-29, 1985, the entire disclosure of which is hereby incorporated by reference.

Figure 2:
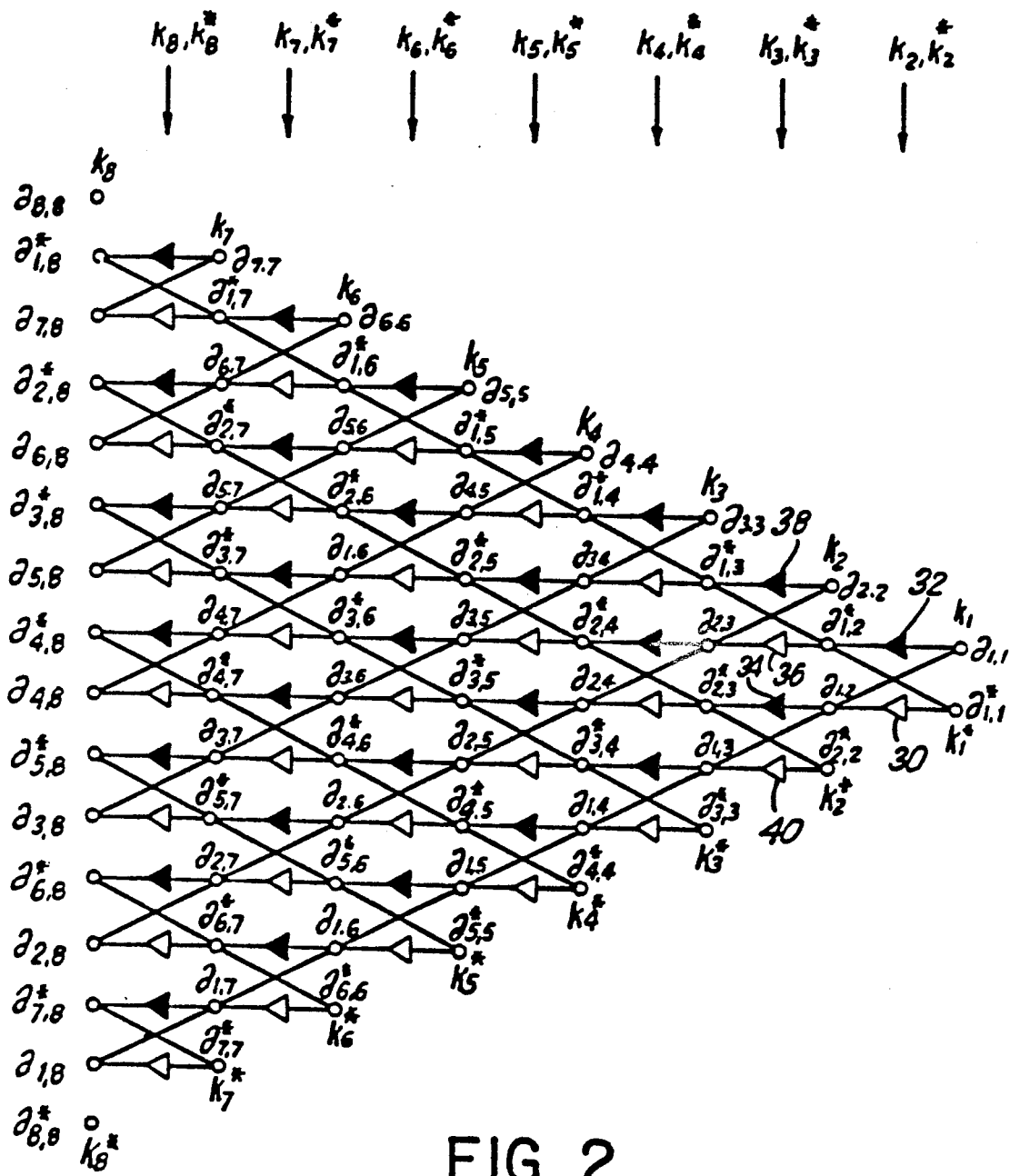
FIG. 2 illustrates the side-fed superlattice, for the non-symmetrical case, for producing linear predictor coefficients $a_{i,j}$, in accordance with the present invention.

Although the lattice coefficients $k_i$ and $k_i^*$ are many times preferred, the direct predictor coefficients $a_{i,j}$ which are useful in spectral estimation, for example, can be derived from the lattice coefficients using the "side-fed superlattice" processing structure of FIG. 2. As shown, the lattice coefficients $k_1^*$ and $k_1$ which are derived from the superlattice of FIG. 1, are applied to a pair of multipliers 30 and 32, which function to multiply those lattice coefficients by the second lattice coefficients $k_2$ and $k_2^*$, respectively, the results of which are individually added to $k_1$ and $k_1^*$ in adders designated by circles, to produce a respective first set of intermediate values $a_{1,2}$ and $a^*_{1,2}$. These values are then multiplied by $k_3^*$ and $k_3$, in multipliers 34 and 36, respectively, and separately added to the quantities $k_2^*$ and $k_2$, to produce the respective intermediate values $a^*_{2,3}$ and $a_{2,3}$. Also, the value of the lattice coefficients $k_2$ and $k_2^*$ are multiplied by $k_3^*$ and $k_3$, respectively, in multipliers 38 and 40, and the intermediate values $a^*_{1,2}$ and $a_{1,2}$ are added to these products to produce further intermediate values $a^*_{1,3}$ and $a_{1,3}$, respectively. This process continues until the direct predictor coefficients $a_{1,8}$ through $a_{8,8}$ and $a^*_{1,8}$ through $a^*_{8,8}$ are produced.

The present invention provides implementations of the side-fed superlattice for both linear prediction and LS-FIR filtering. But first, it will be demonstrated that the computation of the linear prediction coefficients from the lattice coefficients, through the use of the superlattice, is possible by virtue of the similarity of the equations for computing the linear prediction coefficients to the Schur recursions. It will also be shown that the side-fed superlattice structure of FIG. 2 can be augmented as a "superlattice-superladder" structure for computing the direct parameters of an optimum LS-FIR filter from the lattice filter coefficients, the generation of which is discussed in detail in copending application Ser. No. 021,256 by Koukoutsis et al.

Generation of the Linear Prediction Coefficients

The production of the linear (or "direct") prediction coefficients $a_{i,j}$ from the lattice predictor coefficients $k_i$ (or PARCOR's, when used in the symmetrical case) in accordance with the present invention readily lends itself to the use of fast parallel techniques for spectral estimation. The superlattice structure can be used to generate the linear prediction coefficients, from the PARCOR's, as follows:

It is well known from the Levinson-Durbin recursion that:

$$a_{m+1} = \begin{bmatrix} a_m \\ 0 \end{bmatrix} + k_{m+1} \begin{bmatrix} Ja_m \\ 1 \end{bmatrix} \quad (1)$$

which equation relates the linear prediction coefficient vector $a_m$ with the PARCOR's $k_i$, where $$a_m = [a_{m1} a_{m2} \cdots a_{mm}]^T, \quad (2)$$

$a_{m+1}$ is the prediction coefficient vector for order $(m+1)$, and $a_m$ is the same vector having order $(m)$. The exchange operator J, which reverses the sequence of the components of the vector is defined as follows:

$$J = \begin{bmatrix} 00 & \cdots & 01 \\ 00 & \cdots & 10 \\ \cdot & & \cdot \\ \cdot & & \cdot \\ \cdot & & \cdot \\ 10 & \cdots & 00 \end{bmatrix} \quad (3)$$

For example:

$$Ja_m = [a_{mm} \cdots a_{m2} a_{m1}]^T \quad (4)$$

By writing the Levinson recursion for each one of the components of the predictor coefficient vector, for all orders up to $(m+1)$, the following equations, written in the form of nested do-loops, are obtained:

```
for i = 1 to (m + 1) do                          (5)
   for j = 1 to (i − 1) do
      a_{i,j} = a_{i,j−1} + k_i a_{j−i,j−1}
   end of loop
end of loop
```

It will be observed that these relationships have a one-to-one correspondence with the Schur recursions, which are the basis of the superlattice, as follows:

$$\zeta_i^m = \zeta_i^{m-1} + k_m \zeta_{m-1}^{m-1} \quad (6)$$

Thus, using superscripts instead of subscripts and the letter m instead of j, equation (5) can be rewritten as follows:

$$a_i^m = a_i^{m-1} + k_m a_{m-1}^{m-1} \quad (7)$$

which is clearly similar to the Schur recursions of equation (6). The side-fed superlattice shown in FIG. 2 results from the validity of equation (7).

The side-fed superlattice of FIG. 2 shows the more general non-symmetrical case. In the symmetrical case, $k^*_i = k_i$ and $a^*_i = a_i$. Thus, for the symmetrical case, each of the linear prediction coefficients would be computed twice, and this structure can accordingly be reduced.

Figure 3:
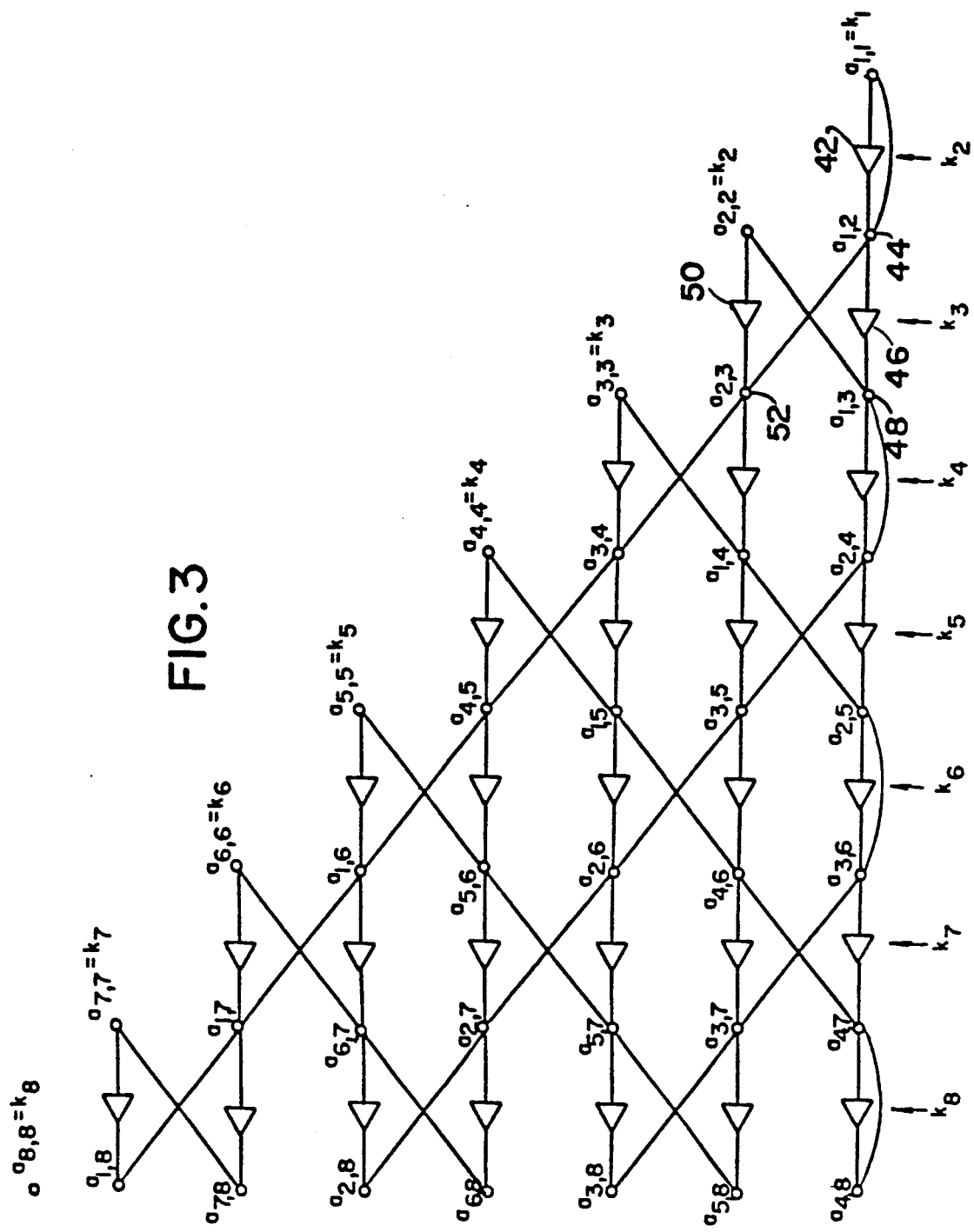
FIG. 3 is an illustration of the side-fed superlattice for the symmetrical case, accordingly reduced in size compared to that of FIG. 2.

FIG. 3 illustrates the side-fed superlattice which is reduced to remove the redundancy for the symmetrical case. The same conventions are used, namely the use of triangles to represent the multiplication operation and small circles used to represent addition. As in the case of the processing structure of FIG. 2, the reduced side-fed superlattice of FIG. 3 receives as its inputs the lattice predictor coefficients $k_{1-8}$ which can be taken from the superlattice of FIG. 1, or more likely for the symmetrical case, from the symmetrical superlattice of FIG. 3 of the parent application, Ser. No. 837,260. In any event, the lattice predictor coefficients are applied to the reduced side-fed superlattice as shown.

Specifically, lattice predictor coefficient $k_1$ is multiplied in multiplier 42 by lattice predictor coefficient $k_2$, and that product is added to lattice predictor coefficient $k_1$ in adder 44 to form one of the first intermediate variables $a_{1,2}$. Intermediate variable $a_{1,2}$ is multiplied by lattice predictor coefficient $k_3$ in multiplier 46 and a second intermediate variable $a_{2,2}$, which is equal to lattice predictor coefficient $k_2$, is added to the product, in adder 48, to form intermediate variable $a_{1,3}$. Intermediate variable $a_{2,3}$ is formed by multiplying $a_{2,2}$ by $k_3$ in multiplier 50, and adding the product to $a_{1,2}$ in adder 52.

This process is repeated by performing the same functions in an iterative manner until the linear predictor coefficients $a_{1,8}$ through $a_{8,8}$ are produced. It will be observed that the lattice predictor coefficients $k_1$–$k_8$ are fed into the structure from the side, to provide intermediate variables $a_{i,j}$, where $i=j$, although in the case of $k_8$, no further processing is required since it is equal to $a_{8,8}$.

Figure 6A:
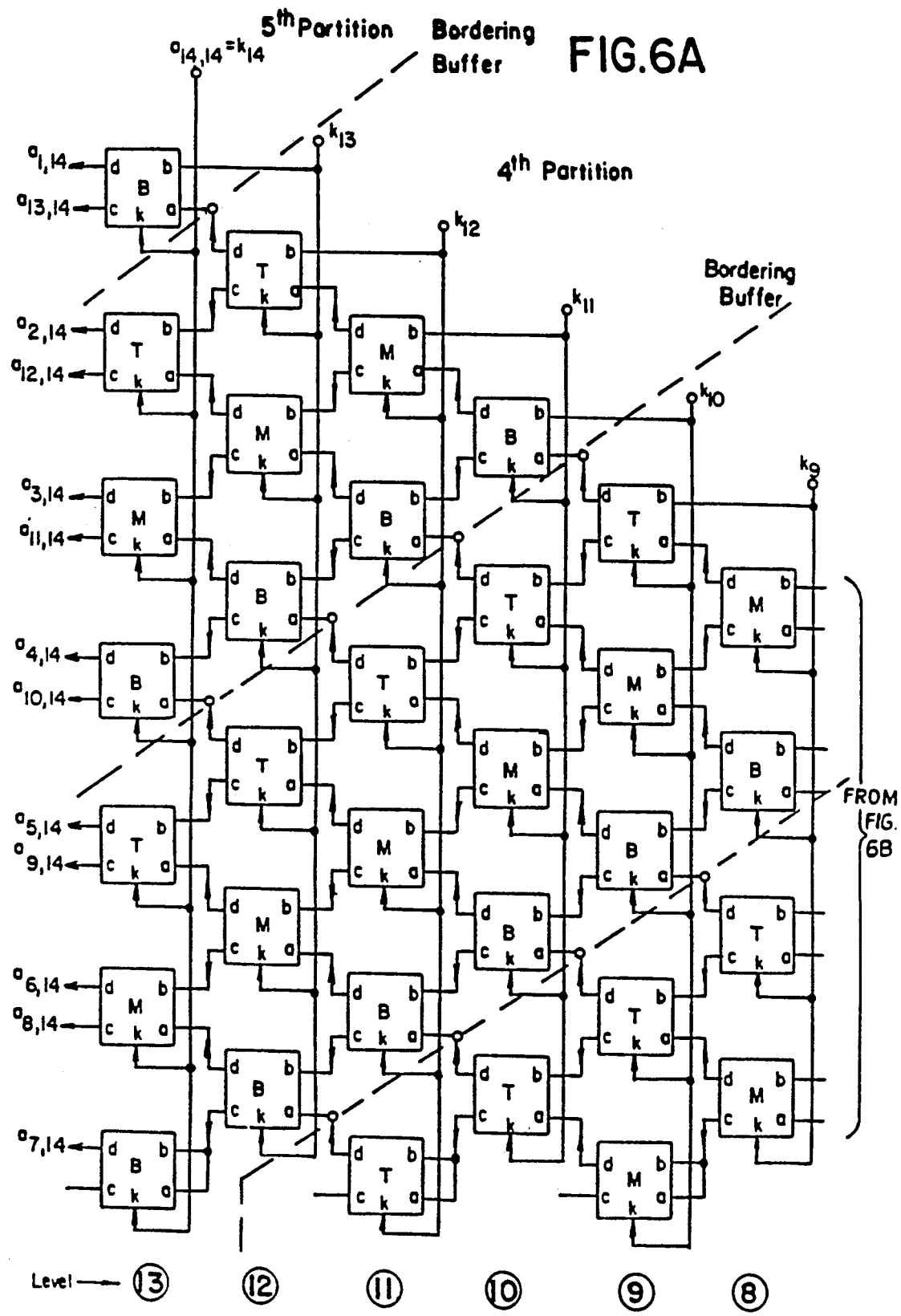
FIG. 6 is a diagram illustrating the signal flow through real and virtual processors required in order to implement the side-fed superlattice of FIG. 5.
Figure 6B:
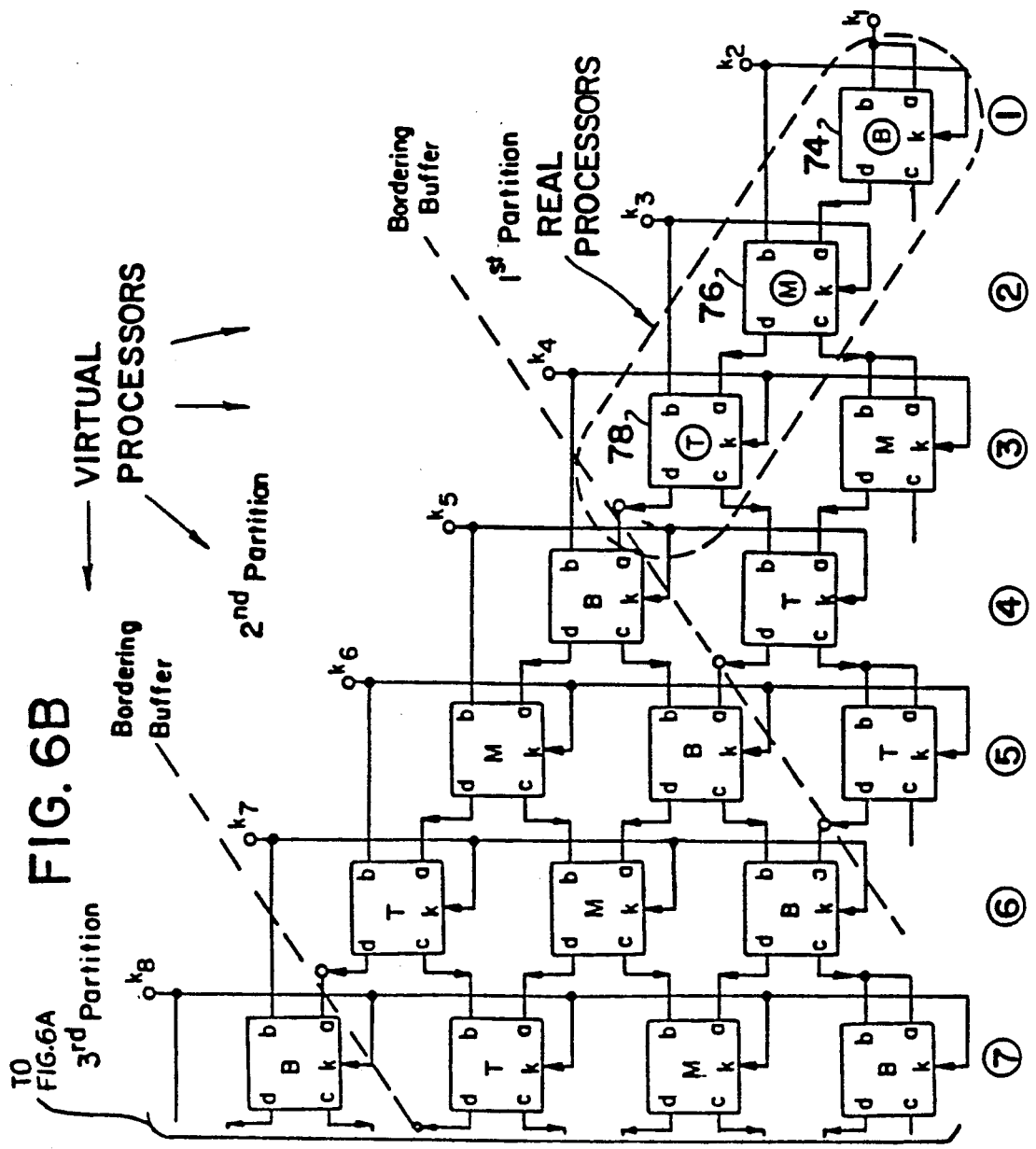

In a manner similar to that provided by the lattice basic cell (LBC), disclosed in FIG. 6 of copending application Ser. No. 904,382, the side-fed superlattice of FIG. 3 can be implemented through the repeated use of LBC's, one of which is illustrated in FIG. 4A. Each LBC receives inputs a, b and $k_i$ and produces outputs c and d, where $c=b+k_ia$ and $d=a+k_ib$. The side-fed superlattice of FIG. 3 can also be formed by the repeated use of the basic cell disclosed in FIG. 4 of the parent application, Ser. No. 837,260, but the use of the LBC of FIG. 4A of the present application results in a more efficient hardware implementation.

As shown in FIG. 4B, the side-fed superlattice of FIG. 3 can be formed from the repeated use of the LBC's. It will be observed that the discontinuity of the side-fed superlattice at the bottom thereof is handled by extending the LBC's, in order to obtain a homogeneous configuration. Specifically, a first LBC 54 receives the quantity $k_1$ as its a and b inputs, and quantity $k_2$ as its k input and produces the quantity $a_{1,2}$, as its c and d outputs, one of which (output c) can be ignored. The quantities $a_{1,2}$ and $a_{2,2}$ ($a_{2,2}$ corresponding to lattice predictor coefficient $k_2$) are applied to the a and b inputs of LBC 56, which also receives lattice predictor coefficient $k_3$ as its k input. LBC 56 produces the quantities $a_{1,3}$ and $a_{2,3}$ at its c and d outputs, respectively. Thus, in a "building block" fashion, the LBC's may be used to form the side-fed superlattice.

In a manner similar to that described in the parent applications, the side-fed superlattice can be implemented in a fully parallel manner by providing seven actual LBC's, 54, 56, 58, 60, 62, 64 and 66, and by applying the lattice predictor coefficients $k_1$–$k_7$ to the b inputs of the LBC's in parallel, (or as the quantities $k_i$ are produced by the superlattice) and thereafter feeding the resulting intermediate variables back to five of the same LBC's 56', 58', 60', 62', 64', for example, to thereby iteratively form the side-fed superlattice, with the progression through the superlattice being downward toward the left. In this notation, LBC 56' is actually the same LBC as 56, and the same is true of LBC's 58, 60, 62 and 64. The process will be continued by feeding back the processed information to LBC's 58, 60 and 62 to thereby emulate LBC's 58'', 60'' and 62'', as shown. The process is complete, and all linear predictor coefficients will be produced, when LBC 60 receives the feedback information to thereby emulate LBC 60'''.

As with the inventions disclosed in the prior copending applications, it will be appreciated that the above-described process can be implemented in a fully parallel manner, as just described above, in a fully sequential manner, where only one LBC exists and information is repetitively fed back to the LBC, which will then emulate all of the LBC's shown in FIG. 4B, or in a "partitioned parallel" manner in which a plurality of LBC's are used, the number of LBC's being less than that required for a fully parallel implementation.

Figure 5A:
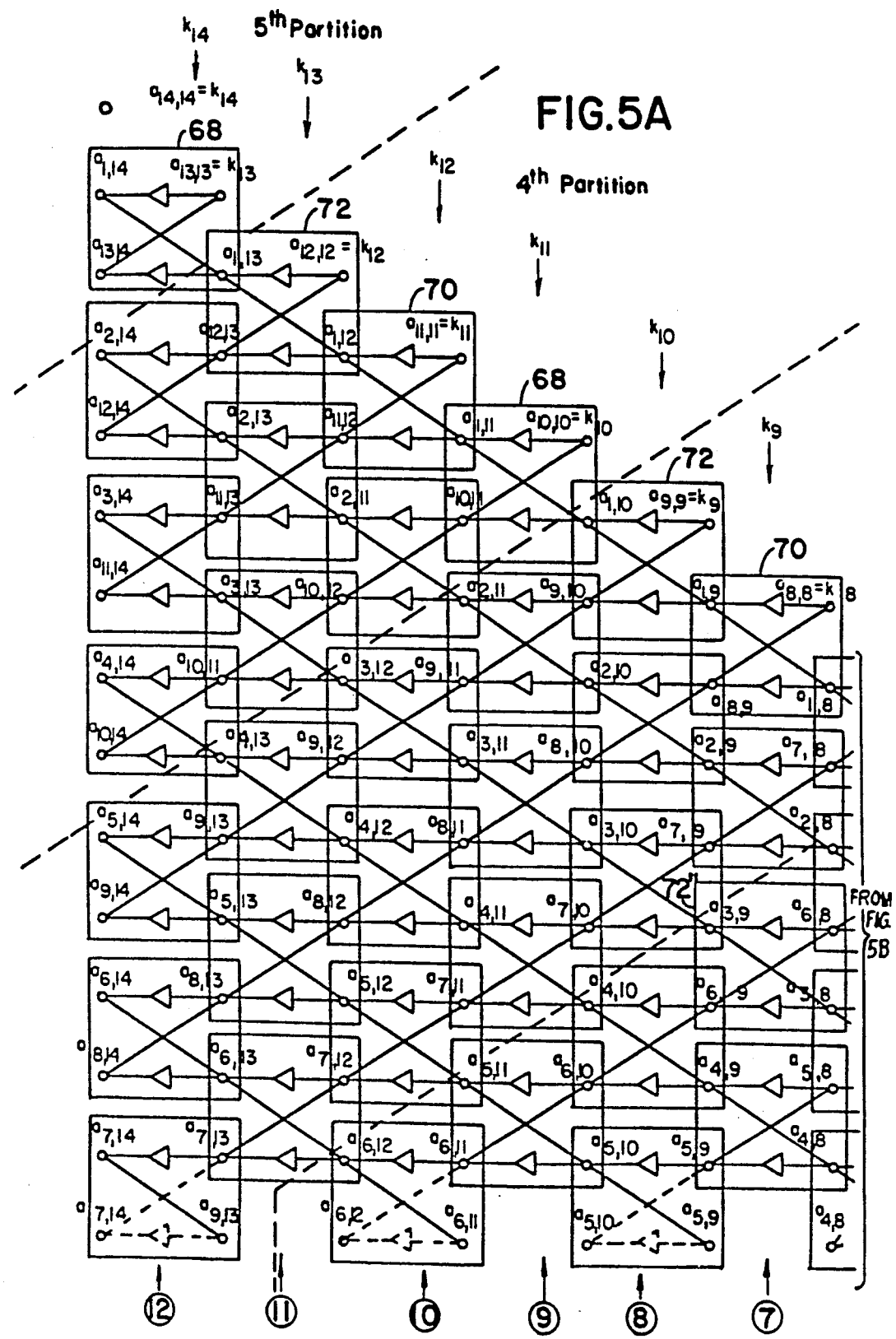
FIG. 5 is an illustration of a partitioned parallel implementation of the side-fed superlattice for a symmetrical system having order 14.
Figure 5B:
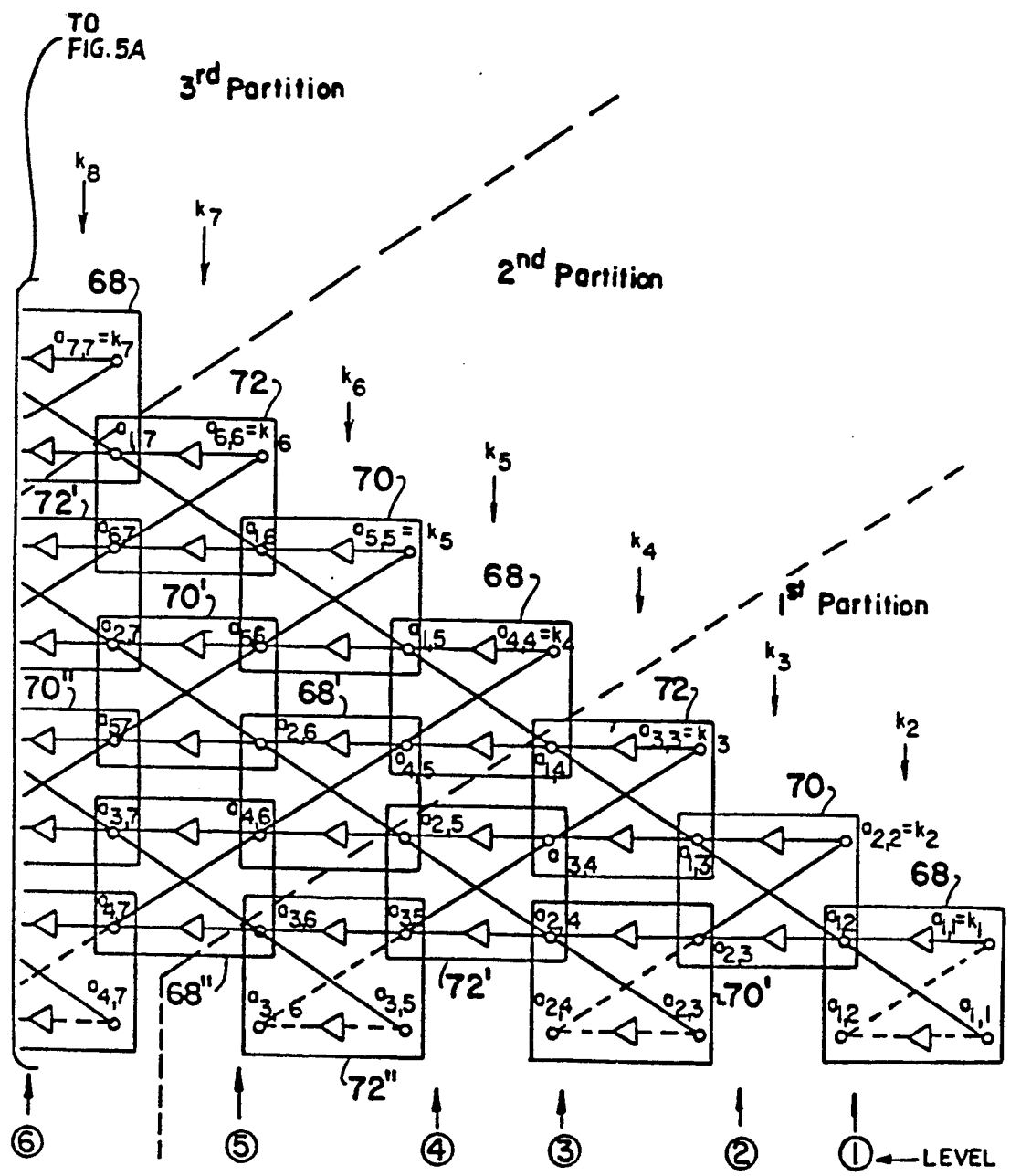

With reference to FIG. 5, one such partitioned parallel implementation is illustrated for a model having order 14. In this implementation, three real LBC's 68, 70 and 72 are employed. At "level" 1, as shown in the figure, LBC 68 receives as inputs $k_1$ and $k_2$ and provides an output, namely $a_{1,2}$ for use by LBC 70 at level 2, along with $k_2$ and $k_3$. LBC 70 produces, at level 2, the quantities $a_{1,3}$ and $a_{2,3}$, for use by LBC 72 and LBC 70' (corresponding to the actual LBC 70). The quantity $a_{2,3}$ is fed back to the input of LBC 70, to thereby emulate LBC 70' while $a_{1,3}$ is applied to LBC 72, along with $k_3$ and $k_4$, at level 3. LBC 72 produces its outputs $a_{1,4}$ and $a_{3,4}$, $a_{1,4}$ being stored for later use. LBC 70' produces $a_{2,4}$, which, along with $a_{3,4}$, is reapplied to LBC 72, to thereby emulate LBC 72', which in turn produces $a_{2,5}$, which is stored for later use, and $a_{3,5}$, which is reapplied to LBC 72, to emulate LBC 72''. LBC 72'' produces $a_{3,6}$, which is stored for later use, and the first partition is complete.

In this manner, the three real LBC's 68, 70 and 72 function to "cut through" the side-fed superlattice to form "partitions", where each partition takes advantage of the parallel processing capabilities of the three processors. Thus, for any number of processors available in a given system, or on a VLSI chip, for example, the side-fed superlattice structures illustrated in FIGS. 4B and 5 represent optimal systems. It will also be appreciated that none of the quantities $a_{i,j}$ (with the exception of the extensions on the lower boundary of the superlattice) are produced more than once, thereby providing an optimal technique.

After completion of the first partition, the values which are stored ($a_{1,4}$, $a_{2,5}$, and $a_{3,6}$) are reapplied to LBC 68, along with $k_4$ and $k_5$, and the processing proceeds through levels 4–10 until the second partition is complete. At that point, the information which is stored, in a manner similar to that for the first partition, is again applied to LBC 68, and the third partition is performed at levels 6–12. This process is repeated for the fourth and final partitions, until the entire set of linear predictor coefficients $a_{1,14}$ through $a_{14,14}$ is produced, $a_{14,14}$ being taken directly from $k_{14}$.

With reference to FIG. 6, a hardware implementation of the side-fed superlattice of FIG. 5 will be explained. The LBC's can each be implemented as either a single two-cycled processor, or as two single-cycled processors, in order to perform the functions set forth in FIG. 4A. Three such actual processors, or "real processors" 74, 76 and 78 are denoted "B", "M", and "T", to denote the bottom, middle and top processors, respectively. Following the signal flow explained with reference to FIG. 5, the first partition is implemented by the bottom processor 74 in level 1, by the middle processor 76 in level 2, by the top and middle processors in level 3, and by the top processor in levels 4 and 5. During the second partition, only the bottom processor is active in level 4, the middle and bottom processors in level 5, all three processors at levels 6 and 7, and so on. Thus, although only three processors 74, 76 and 78 are provided, the intermediate variables can be stored and fed back when appropriate in order to emulate the "virtual" processors, to produce the side-fed superlattice. As used herein, the term "virtual processors" may be taken to include the real processors as well.

FIG. 7 illustrates an example of an actual hardware implementation of the side-fed superlattice using the parallel partitioned implementation with three processors. The bottom, middle and top processors 74, 76 and 78, corresponding to the real processors of FIG. 6, are employed, and each contains the lattice basic cell shown in FIG. 4A, with associated logic, and a, b, c, d and k registers. An a-buffer 80 receives the output from the d register from each of the top, middle and bottom processors via an a-bus 82. In each of the top, middle and bottom processors, the a and b registers provide an input to their associated LBC's and logic, and the LBC's and logic produce an output which is applied to the associated c and d registers. Each LBC receives an additional input from the associated k register, which in turn receives an input from the k-buffer 84 via k-bus 86.

Each b register in the top, middle and bottom processors receives one input from its associated c register and from the k-bus 86. The a register in the top processor 78 receives an input from the d register of the middle processor 76, and likewise, the a register in the middle processor 76 receives an input from the d register in bottom processor 74. The a register in the bottom processor 74, on the other hand, receives an input from its associated c register, the bordering buffer 88, via the bordering buffer bus 90, and the a and b registers in the bottom processor receive a further input from the k-bus 86. Finally, the output of the d register in each of the top, middle and bottom processors is applied to the bordering buffer bus 90.

The detailed operation of the hardware shown in FIG. 7 is described through the use of a symbolic language, in order to present the operations efficiently.

| Definitions | |
|---|---|
| B: bottom processor | |
| M: middle processor | |
| T: top processor | |
| a(.) | |
| b(.) | registers of . processor |
| c(.) | e.g.: a(M): the a register of the middle |
| d(.) | processor. |
| k(.) | |
| $bb_i$: | i-th location of the bordering buffer |
| $k_i$: | i-th location of the k-buffer |
| $a_i$: | i-th location of the a-buffer |
| C [processor 1, processor 2, processor 3; p, L]: concurrent operation of processor 1 ... processor 3 (one, two or three processors: at least one processor must be active) of partition p and level L. | |
| eg: C [B, M; 2, 5]: concurrent operation of the bottom and middle processors of the 2nd partition, 5th level. | |
| C [B; 2, 4]: operation of the bottom processor only, 2nd partition, 4th level (a kind of degenerated concurrent operation) | |
| location 1 → location 2: data transfer from location 1 to location 2; locations 1 and 2 may be processor registers or buffer locations. | |
| Examples of transfers: | |
| c(B) → $a_{10}$: | The contents of the c register of the bottom processor are transferred to the 10th location of the a-buffer. |
| d(T) → $bb_1$: | The contents of the d register of the top processor are transferred to the first location of the bordering buffer. |
| location 1 → (location 2 ... location m): The contents of location 1 are simultaneously transferred (through a bus) to the locations 2 ... m. | |
| eg: $k_{10}$ → (k(B), k(M), K(T)): The k registers of the bottom, middle, top processors are initialized through the k-bus with the contents of the 10th location of the k-buffer. | |
| transfer 1 ⎫<br>. ⎬<br>. ⎪<br>transfer m ⎭ | The transfers 1 ... m can occur in any order, even simultaneously, if possible. |
| transfer 1<br>.<br>.<br>transfer m | The transfers 1 ... m must occur one after the other in a strictly sequential manner. |

A combination of the last two cases can occur during the same phase.

For example:

transfer 1 ⎫
transfer 2 ⎬
transfer 3 ⎭
transfer 4
transfer 5 ⎫
transfer 6 ⎬

The transfers 1, 2 and 3 can occur in any order. However, all three of them must precede transfer 4. After the 4th transfer, transfers 5 and 6 can occur in any order.

The operation of the hardware scheme of FIG. 7, based on the signal flow diagram of FIG. 6, is described below, for a system of order 14. The generalization for any order will be understood by those skilled in the art, in view of the disclosure herein.

| | Partition 1 |
|---|---|
| Phase 1) | $k_1$ → (a(B), b(B)) <br> $k_2$ → k (B) |
| Phase 2) | C[B; 1, 1] |
| Phase 3) | $k_3$ → k (M) <br> d (B) → a (M) |
| Phase 4) | C [M; 1, 2] |
| Phase 5) | $k_4$ → (k(M), k(T)) <br> d (M) → a(T) <br> c (M) → (a(M), b(M)) |
| Phase 6) | C [M, T; 1, 3] |
| Phase 7) | d(M) → a(T) <br> c(T) → b(T) <br> d(T) → $bb_1$ <br> $k_5$ → k(T) |
| Phase 8) | C [T; 1, 4] |
| Phase 9) | c (T) → (a(T), b(T)) <br> d (T) → $bb_2$ <br> $k_6$ → k(T) |
| Phase 10) | C [T; 1, 5] |
| Phase 11) | d(T) → $bb_3$ |
| | Partition 2 |
| Phase 12) | $k_5$ → k(B) <br> $bb_1$ → a(B) <br> $k_4$ → b(B) |
| Phase 13) | C [B; 2, 4] |
| Phase 14) | $bb_2$ → a(B) <br> c(B) → b(B) <br> d(B) → a(M) <br> $k_6$ → (k(B), k(M)) |
| Phase 15) | C [B, M; 2, 5] |
| Phase 16) | $bb_3$ → a(B) <br> c(B) → b(B) <br> d(B) → a(M) <br> c(M) → b(M) <br> d(M) → a(T) <br> $k_6$ → b(T) <br> $k_7$ → (k(B), k(M), k(T)) |
| Phase 17) | C [B, M, T; 2, 6] |
| Phase 18) | c(B) → (a(B), b(B)) <br> d(B) → a(M) <br> c(M) → b(M) <br> d(M) → a(T) <br> c(T) → b(T) <br> d(T) → $bb_1$ <br> $k_8$ → (k(B), k(M), k(T)) |
| Phase 19) | C [B, M, T; 2, 7] |
| Phase 20) | d(B) → a(M) |

-continued

|  |  |
|---|---|
|  | $c(M) \rightarrow b(M)$ |
|  | $d(M) \rightarrow a(T)$ |
|  | $c(T) \rightarrow b(T)$ |
|  | $d(T) \rightarrow bb_2$ |
|  | $k_9 \rightarrow (k(M), k(T))$ |
| Phase 21) | C [M, T; 2, 8] |
| Phase 22) | $c(M) \rightarrow (a(M), b(M))$ |
|  | $d(M) \rightarrow a(T)$ |
|  | $c(T) \rightarrow b(T)$ |
|  | $d(T) \rightarrow bb_3$ |
|  | $k_{10} \rightarrow (k(M), k(T))$ |
| Phase 23) | C [M, T; 2, 9] |
| Phase 24) | $d(M) \rightarrow a(T)$ |
|  | $c(T) \rightarrow b(T)$ |
|  | $d(T) \rightarrow bb_4$ |
|  | $k_{11} \rightarrow k(T)$ |
| Phase 25) | C [T; 2, 10] |
| Phase 26) | $c(T) \rightarrow (a(T), b(T))$ |
|  | $d(T) \rightarrow bb_5$ |
|  | $k_{12} \rightarrow k(T)$ |
| Phase 27) | C [T; 2, 11] |
| Phase 28) | $d(T) \rightarrow bb_6$ |
| Phase 29) | $bb_1 \rightarrow a(B)$ |
|  | $k_7 \rightarrow b(B)$ |
|  | $k_8 \rightarrow k(B)$ |
| Phase 30) | C [B; 3, 7] |
| Phase 31) | $bb_2 \rightarrow a(B)$ |
|  | $c(B) \rightarrow b(B)$ |
|  | $d(B) \rightarrow a(M)$ |
|  | $k_8 \rightarrow b(M)$ |
|  | $k_9 \rightarrow (k(B), k(M))$ |
| Phase 32) | C [B, M; 3, 8] |

The continuation of this procedure will be apparent to those skilled in the art in view of the foregoing.

Generation of the Direct Finite Impulse Response Filter Coefficients

The side-fed superlattice, described above, can be used with a "superladder" structure, similar to that described in copending application Ser. No. 021,256, in order to compute direct LS-FIR filter coefficients $c_{i,j}$.

The computation of the direct LS-FIR filter coefficients is done through the following "Levinson-type" recursion.

$$c_{m+1} = \begin{bmatrix} c_m \\ 0 \end{bmatrix} + k^c_{m+1} \begin{bmatrix} Ja_m \\ 1 \end{bmatrix} \quad (8)$$

Equation (8) can be written in the form of a nested do loop as follows:

```
for i = 1 to (m + 1) do                    (9)
    for j = 1 to (i - 1) do
        c_{i,j} = c_{i,j-1} + k^f a_{j-i,j-1}
    end of loop
end of loop
```

It will be observed that there is a remarkable similarity to the recursions:

$$\tau_i^m = \tau_i^{m-1} + k_m{}^c \zeta_{m-i}{}^{m-1} \quad (10)$$

which, along with the recursions $$\zeta_i^m = \zeta_i^{m-1} + k_m \zeta_{m-i}{}^{m-1} \quad (11)$$

are the basis of the superlattice-superladder structure. Using superscripts instead of subscripts and m instead of j, we can write equation (9) as follows:

$$c_i{}^m = c_i{}^{m-1} + k_m{}^c a_{m-i}{}^{m-1} \quad (12)$$

which is similar to equation (10). Based on this relationship, a signal processing structure, or "superladder", illustrated in FIG. 8 in bold lines, can be defined and placed on top of the superlattice, the entire structure being referred to as a "side-fed superlattice-superladder".

Figure 8:
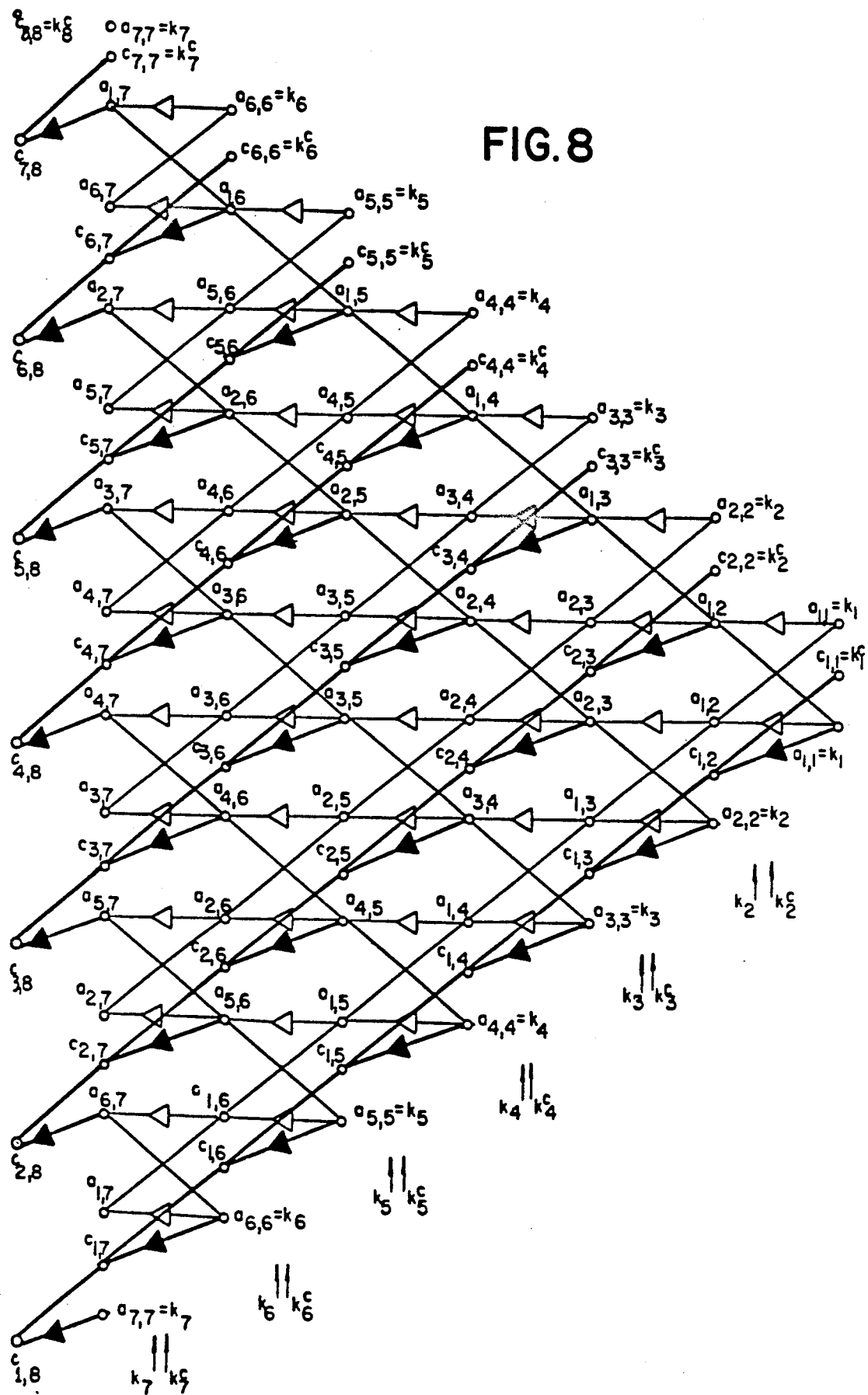
FIG. 8 is an illustration of the side-fed superlattice-superladder structure for producing direct filter coefficients $c_{i,j}$.

In FIG. 8 the white triangles, which form part of the superlattice, function as before, to multiply the lattice predictor coefficients $k_i$ by the input quantities $a_{i,j}$. The black triangles, which form part of the superladder, function to multiply the input quantities $a_{i,j}$ by the lattice filter coefficients $k_i^c$, which are produced from the superlattice-superladder structure illustrated in FIG. 4 of co-pending application Ser. No. 021,256. The lattice predictor coefficients $k_1$-$k_7$ and lattice filter coefficients $k_1^c$-$k_8^c$ are fed into the structure, and the direct filter coefficients $c_{1,8}$-$c_{8,8}$ are produced as shown.

The superlattice-superladder structure of FIG. 8 is shown for the symmetrical case, but it will be observed that the superlattice portion of the structure is not reduced, but rather is the same size as the superlattice of FIG. 2 for the non-symmetrical case. The side-fed superlattice-superladder structure of FIG. 8 is therefore highly redundant, since each $a_{i,j}$ is computed twice. However, it will also be appreciated that the superladder portion, which produces quantities $c_{i,j}$, and which covers the entire superlattice, is not redundant. Therefore, in order to reduce to a minimum the number of operations, the superlattice must be reduced to a half lattice structure, in a manner similar to that illustrated in FIG. 3, above, and the superladder must be "folded" onto the half-lattice structure.

FIG. 9 illustrates the resulting non-redundant side-fed superlattice-superladder structure. Again, the same convention is used where the white triangles function to multiply the input value by the lattice predictor coefficient $k_i$ and the black triangles function to multiply the input value by the lattice filter coefficients $k_i^c$. Also, the circles indicate the addition operation. Specifically, lattice predictor coefficient $k_1$, also referred to as $a_{1,1}$, for the sake of uniformity with the intermediate variables, is multiplied in multiplier 92 by lattice predictor coefficient $k_2$, and the result is added to lattice predictor coefficient $k_1$ in adder 94, to produce the intermediate variable $a_{1,2}$. The lattice predictor coefficient $k_1$ is also multiplied in multiplier 96 by the lattice filter coefficient $k_2^c$, and the result is added to the lattice filter coefficient $k_1^c$ in adder 98 to produce intermediate variable $c_{1,2}$. These intermediate variables are fed to a further stage of the superlattice-superladder, along with lattice predictor coefficient $k_2$ and lattice filter coefficient $k_2^c$, which are fed into the side of the superlattice as variables $a_{2,2}$ and $c_{2,2}$, respectively, and the processing continues, as shown. As in the case of the superlattice-superladder of FIG. 8, the direct filter coefficients $c_{1,8}$-$c_{8,8}$ are produced, the coefficient $c_{8,8}$, of course, being taken directly from the lattice filter coefficient $k_8^c$. At the leftmost end of the structure, only the result of the superladder, namely the linear filter coefficients $c_{1,8}$-$c_{8,8}$, are meaningful, since $k_8$, is not available.

FIG. 10 illustrates a basic cell of the structure shown in FIG. 9. The basic cell receives inputs a, b, c, d, $k_i$ and $k_i^c$ and produces outputs e, f, g and h, as follows:

$$e = c + k_i^f a$$

$$f = d + k_i a$$

$$g = a + k_i d$$

$$h = b + k_f^c d$$

The basic cell of FIG. 10 is formed of the lattice basic cell of FIG. 4A, to produce outputs f and g from inputs a, d and $k_i$, and a superladder portion, shown in bold lines, to produce outputs e and h from inputs a, b, c, d and $k_f^c$.

Figure 11:
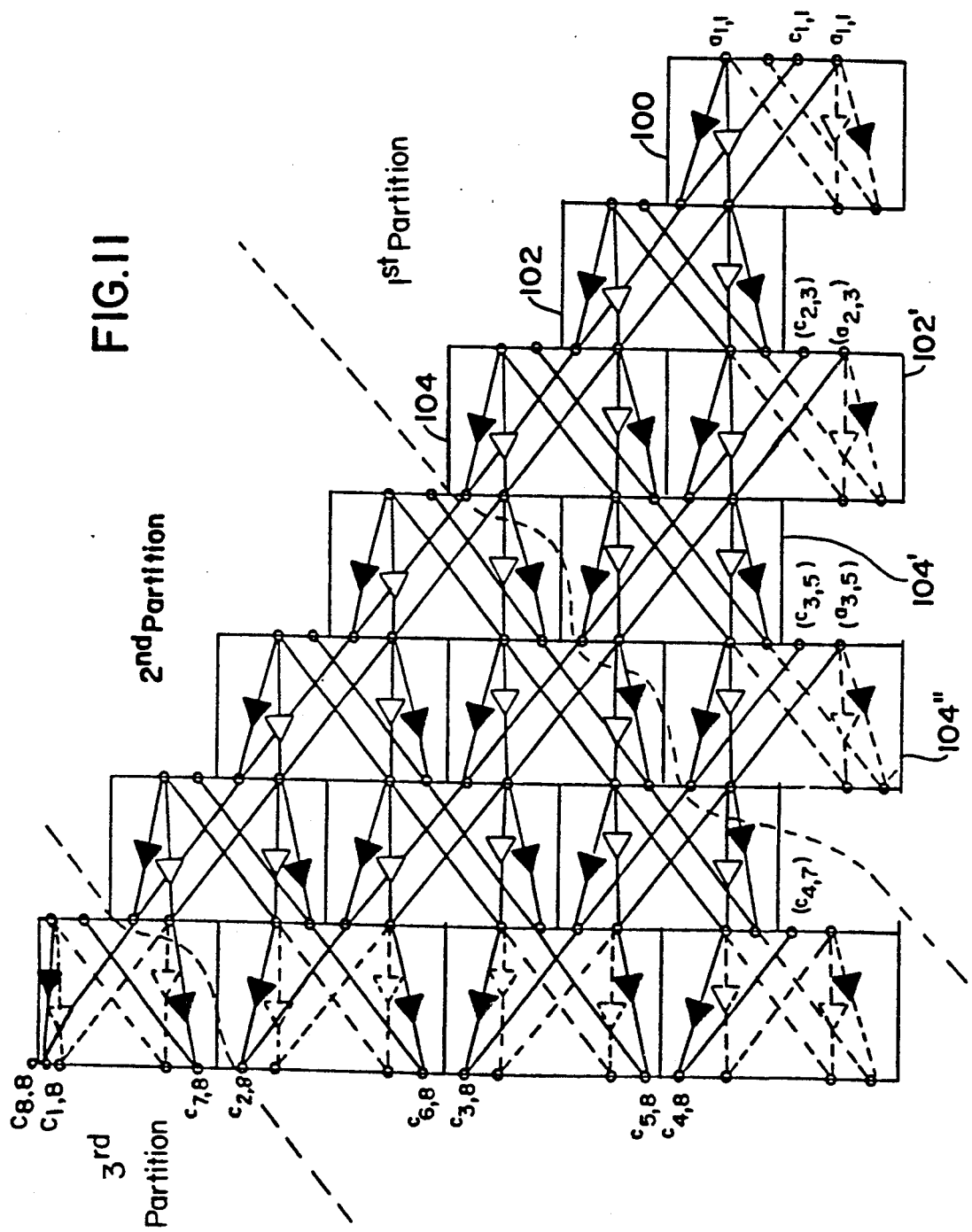
FIG. 11 illustrates the repeated use of the basic cell of FIG. 10 in order to implement the reduced side-fed superlattice-superladder structure of FIG. 9, in a "building block" manner.

FIG. 11 shows an implementation of the superladder-superlattice structure of FIG. 9 using the basic cell illustrated in FIG. 10, where three such basic cells 100, 102 and 104 are employed. In a manner similar to that explained with reference to the side-fed superlattice of FIG. 5, the basic cells 100, 102 and 104 of the side fed superlattice-superladder process the input variables along a first partition, as shown in the figure, in a parallel manner, and then recursively process the input signals in through a second partition, and later a third partition, to thereby effect a partitioned parallel implementation of the side-fed superlattice-superladder, resulting in the linear LS-FIR filter coefficients $c_{1,8}-c_{8,8}$. It will be appreciated that the basic cells along the bottom of the side fed superlattice-superladder extend beyond the structure illustrated in FIG. 9, but are provided as shown in FIG. 11 to provide a homogeneous hardware implementation. The inputs to the basic cells are the same as shown in FIG. 9, except for the variables applied to the lower extensions, which are shown in parentheses. Also, since only the outputs corresponding to the superladder portion of the structure at the leftmost basic cells are meaningful, the leftmost basic cells are used in order to obtain a homogeneous hardware structure, and the outputs corresponding to the superlattice portion of those cells (as shown by dashed lines) may be ignored.

It will also be appreciated that the side-fed superlattice-superladder structure shown in FIG. 11 may be implemented in a fully parallel or fully sequential manner. The detailed hardware implementation of the side-fed superlattice-superladder of FIG. 11, analogous to that of FIG. 7, will be apparent to those skilled in the art in view of the description herein.

Various changes and variations to the present invention will occur to those skilled in the art in view of the foregoing description. It is intended that all such changes and variations be encompassed so long as the present invention is employed, as defined by the following claims.

What is claimed is:

1. Apparatus for receiving a plurality of lattice predictor coefficients of a system having an order, and for producing therefrom direct predictor coefficients of said system, comprising:
   a plurality of parallel processing units, the number of which is less than the order of said system, each of said processing units having input and output terminals and producing values at said output terminals as a function of values applied to said input terminals in accordance with a predefined recursion;
   a buffer for initially applying to said input terminals of said plurality of parallel processing units less than all of said lattice predictor coefficients; and
   controlled feedback circuitry for feeding back selected ones of the values produced at the output terminals of said parallel processing units to selected input terminals thereof, said controlled feedback circuitry continuing said feeding back of selected outputs of said processing units to selected input terminals to thereby produce a first partition; said buffer applying at least one additional lattice predictor coefficient to at least one of said input terminals of at least one of said plurality of parallel processing units after said first partition is produced, and said controlled feedback circuitry continuing said feeding back of selected outputs of said processing units to selected input terminals to thereby produce at least a second partition, and any subsequent partitions that are necessary, until said direct predictor coefficients are produced at said output terminals.

2. The apparatus of claim 1 further including a storage device for storing values from at least one selected output terminal of at least one of said processing units during said first partition, said storage device providing said stored values to an input terminal of at least one of said processing units during said second partition.

3. The apparatus of claim 1 wherein, during said first partition, said controlled feedback circuitry feeds back selected ones of the values produced at the output terminals of said processing units to the input terminals of a lesser number of said processing units than the number of processing units from which said selected ones of said values were taken, and said controlled feedback circuitry continues said feeding back until said selected outputs are fed back to a single processing unit.

4. The apparatus of claim 1 wherein, during said first partition, said buffer applies a number of lattice predictor coefficients to said parallel processing units, said number being related to the number of said parallel processing units.

5. The apparatus of claim 1 wherein each processing unit is comprised of a single two-cycled processor.

6. The apparatus of claim 1 wherein each processing unit is comprised of two single-cycled processors.

7. The apparatus of claim 1 wherein each processing unit is comprised of a lattice basic cell processing unit.

8. Apparatus for receiving a plurality of lattice predictor and filter coefficients of a system having an order, and for producing therefrom direct filter coefficients of said system, comprising:
   a plurality of parallel processing units, the number of which is less than the order of said system, each of said processing units having input and output terminals and producing values at said output terminals as a function of values applied to said input terminals in accordance with a predefined recursion;
   a buffer for initially applying to said input terminals of said plurality of parallel processing units less than all of said lattice predictor and filter coefficients; and
   controlled feedback circuitry for feeding back selected ones of the values produced at the output terminals of said parallel processing units to selected input terminals thereof, said controlled feedback circuitry continuing said feeding back of selected outputs of said processing units to selected input terminals to thereby produce a first partition; said buffer applying at least one additional lattice predictor and filter coefficient to said input terminals of at least one of said plurality of parallel processing units after said first partition is produced, and said controlled feedback circuitry continuing said feeding back of selected outputs of said processing units to selected input terminals to thereby produce at least a second partition, and any subsequent partitions that are necessary, until said direct filter coefficients are produced at said output terminals.

9. The apparatus of claim 8 further including a storage device for storing values from at least one selected output terminal of at least one of said processing units during said first partition, said storage device providing said stored values to an input terminal of at least one of said processing units during said second partition.

10. The apparatus of claim 8 wherein, during said first partition, said controlled feedback circuitry feeds back selected ones of the values produced at the output terminals of said processing units to the input terminals of a lesser number of said processing units than the number of processing units from which said selected ones of said values were taken, and said controlled feedback circuitry continues said feeding back until said selected outputs are fed back to a single processing unit.

11. The apparatus of claim 8 wherein, during said first partition, said buffer applies a number of lattice predictor and filter coefficients to said parallel processing units, said number being related to the number of said parallel processing units.

12. The apparatus of claim 8 wherein each of said processing units is comprised of a lattice basic cell processing unit.

13. A method for producing direct predictor coefficients of a system having an order, comprising:
receiving a plurality of lattice predictor coefficients of said system;
initially applying less than all of said lattice predictor coefficients to the input terminals of a plurality of parallel processing units, the number of which is less than the order of said system;
producing values at output terminals of said processing units as a function of values applied to said input terminals in accordance with a predefined recursion;
feeding back selected ones of the values produced at the output terminals of said parallel processing units to selected input terminals thereof;
continuing said feeding back of selected outputs to thereby produce and complete a first partition;
applying at least one additional lattice predictor coefficient to at least one of said input terminals of at least one of said parallel processing units after said first partition is completed; and
continuing said feeding back of selected outputs to thereby produce at least a second partition, and any subsequent partitions that are necessary, until said direct predictor coefficients are produced at said output terminals.

14. The method of claim 13 further comprising:
storing values from at least one selected output terminal of at least one of said processing units during said first partition; and
applying said stored values to an input terminal of at least one of said processing units during said second partition.

15. The method of claim 13 wherein, during said first partition, said step of feeding back comprises:
feeding back selected ones of the values produced at the output terminals of said processing units to the input terminals of a lesser number of said processing units than the number of processing units from which said selected ones of said values were taken; and
continuing said feeding back until said selected outputs are fed back to a single processing unit.

16. The method of claim 13 wherein, during said first partition, said step of initially applying comprises the step of applying a number of lattice predictor coefficients to said parallel processing units, said number being related to the number of said parallel processing units.

17. The method of claim 13 wherein each processing unit performs two multiplications in a single cycle.

18. The method of claim 13 wherein each processing unit performs two multiplications in two cycles.

19. The method of claim 13 wherein less than all of said lattice predictor coefficients are initially applied to the input terminals of a plurality of lattice basic cell parallel processing units.

20. A method for producing direct filter coefficients of a system having an order, comprising:
receiving a plurality of lattice predictor and filter coefficients of said system;
initially applying less than all of said lattice predictor and filter coefficients to the input terminals of a plurality of parallel processing units, the number of which is less than the order of said system;
producing values at output terminals of said processing units as a function of values applied to said input terminals in accordance with a predefined recursion;
feeding back selected ones of the values produced at the output terminals of said parallel processing units to selected input terminals thereof;
continuing said feeding back of selected outputs to thereby produce and complete a first partition;
applying at least one additional lattice predictor and filter coefficient to said input terminals of at least one of said parallel processing units after said first partition is completed; and
continuing said feeding back of selected outputs to thereby produce at least a second partition, and any subsequent partitions that are necessary, until said direct filter coefficients are produced at said output terminals.

21. The method of claim 20 further comprising:
storing values from at least one selected output terminal of at least one of said processing units during said first partition; and
applying said stored values to an input terminal of at least one of said processing units during said second partition.

22. The method of claim 20 wherein, during said first partition, said step of feeding back comprises:
feeding back selected ones of the values produced at the output terminals of said processing units to the input terminals of a lesser number of said processing units than the number of processing units from which said selected ones of said values were taken; and
continuing said feeding back until said selected outputs are fed back to a single processing unit.

23. The method of claim 20 wherein, during said first partition, said step of initially applying comprises the step of applying a number of lattice predictor and filter coefficients to said parallel processing units, said number being related to the number of said parallel processing units.

24. The method of claim 20 wherein less than all of said lattice predictor and filter coefficients are initially applied to the input terminals of a plurality of lattice basic cell parallel processing units.

* * * * *